US009453858B2

(12) United States Patent
Seal et al.

(10) Patent No.: US 9,453,858 B2
(45) Date of Patent: Sep. 27, 2016

(54) SENSOR DEVICE AND METHOD OF MANUFACTURE AND USE (71) Applicant: Current Technologies LLC, Germantown, MD (US)

(72) Inventors: Lowell G. Seal, Reisterstown, MD (US); Kartikeya Tripathi, Clarksburg, MD (US); David S. Yaney, Poolesville, MD (US)

(73) Assignee: Current Technologies, LLC, Germantown, MD (US)

( * ) Notice: Subject to any disclaimer, the term of this patent is extended or adjusted under 35 U.S.C. 154(b) by 247 days.

(21) Appl. No.: 13/895,862

(22) Filed: May 16, 2013

(65) Prior Publication Data

US 2013/0307526 A1   Nov. 21, 2013

Related U.S. Application Data (60) Provisional application No. 61/648,012, filed on May 16, 2012.

(51) Int. Cl.
  G01R 11/185   (2006.01)
  G01R 15/18    (2006.01)
  (Continued)

(52) U.S. Cl.
  CPC .......... G01R 11/185 (2013.01); G01R 15/186 (2013.01); H01F 27/2804 (2013.01); H01F 38/30 (2013.01); *H01F 2038/305* (2013.01); *Y10T 29/49126* (2015.01)

(58) Field of Classification Search
  CPC .. G01R 11/185; G01R 11/02; G01R 15/186; G01R 19/32; G01R 1/203; G01R 5/14; H01F 38/30; H01F 27/2804; H01F 2838/305; Y10T 29/49126
  USPC ........................................................ 324/105
  See application file for complete search history.

(56) References Cited

U.S. PATENT DOCUMENTS 5,461,309 A   10/1995   Baudart
7,106,162 B2   9/2006   Saito
(Continued)

FOREIGN PATENT DOCUMENTS

CA   WO 2009009878 A1 *  1/2009  ............... H04B 3/54
WO       02/45228 A1     6/2002

OTHER PUBLICATIONS

Djokic, B.V. et al., "To What Extent Can the Current Amplitude Linearity of Rogowski Coils Be Verified?", IEEE Xplore Abstract, http://ieeexplore.ieee.org/xpl/login.jsp?tp=&arnumber=5680646 &url=http%3A%2F%2Fieeexplore.ieee.org%2Fxpls%2Fabs_all.jsp%3Farnumber%D5680646, 2 pages, Jul. 1, 2011. [Cited in International Search Report dated Jul. 29, 2013 for PCT/US2013/041333, filed May 16, 2013; Abstract attached].

(Continued)

*Primary Examiner* — Melissa Koval
*Assistant Examiner* — Felicia Farrow
(74) *Attorney, Agent, or Firm* — Cooley LLP (57) ABSTRACT In some embodiments a method includes receiving, from a sensor device, a signal indicative of a voltage associated with a current passing over a line that is disposed through the sensor device. The method includes receiving, from the sensor device, a signal indicative of (1) a calibrated sensitivity of the sensor device, (2) a calibrated temperature of the sensor device, and (3) an ambient temperature that was received from an ambient temperature sensor. The method includes defining an actual sensitivity of the sensor device based on (1) the calibrated sensitivity of the sensor device, (2) the calibrated temperature of the sensor device, and (3) the ambient temperature. The method includes sending a signal indicative of a modified electric current value based on (1) the voltage and (2) the actual sensitivity of the sensor device.

21 Claims, 8 Drawing Sheets (51) Int. Cl.
   *H01F 27/28* (2006.01)
   *H01F 38/30* (2006.01)

(56) References Cited

U.S. PATENT DOCUMENTS

| | | | |
|---|---|---|---|
| 7,321,226 B2* | 1/2008 | Yakymyshyn | G01R 15/207 324/117 H |
| 2004/0257061 A1* | 12/2004 | George de Buda | G01R 15/186 324/117 R |
| 2008/0246507 A1* | 10/2008 | Gunn | G01R 1/22 324/764.01 |
| 2009/0284248 A1 | 11/2009 | Etter et al. | |
| 2012/0019233 A1 | 1/2012 | Juge et al. | |

OTHER PUBLICATIONS

Porto, D. et al., "Design of a new air-cored current transformer: analytical modeling and experimental validation", IEEE Xplore Abstract, http://ieeexplore.ieee.org/xpl/login.jsp?tp=&arnumber=1348456&url=http%3A%2F%2Fieeexplore.ieee.org%2Fxpls%2Fabs_all.jsp%3Farnumber%3D1348456, 2 pages, Oct. 3, 2004. [Cited in International Search Report dated Jul. 29, 2013 for PCT/US2013/041333, filed May 16, 2013; Abstract attached].

International Search Report and Written Opinion, dated Jul. 29, 2013 for PCT/US2013/041333, filed May 16, 2013.

International Preliminary Report on Patentability, issued Nov. 18, 2014 for PCT/US2013/041333, filed May 16, 2013.

* cited by examiner

| Disposing a first printed circuit board into a first seat of a lower portion of a stabilizing apparatus and a second printed circuit board into a second seat, spaced apart from the first seat, of the of the lower portion of the stabilizing apparatus | 702 |

| Advancing a flexible printed circuit through the first printed circuit board and the second printed circuit board | 704 |

| Disposing an upper portion of the stabilizing apparatus into contact with the lower portion of the stabilizing apparatus such that the first printed circuit board is disposed in a first seat of the upper portion and the second printed circuit board is disposed in a second seat of the upper portion | 706 |

| Attaching the first printed circuit board and the second printed circuit board to the flexible printed circuit to define a printed circuit board assembly | 708 |

| Disposing the printed circuit board assembly within a shell to define a sensor portion of an electrical current measurement device | 710 |

SENSOR DEVICE AND METHOD OF MANUFACTURE AND USE

RELATED APPLICATIONS

The present invention claims priority to U.S. Provisional Application No. 61/648,012 filed on May 16, 2012 and titled "Sensor Device and Method of Manufacture and Use," the contents of which is herein incorporated by reference in its entirety.

BACKGROUND

The present invention generally relates to methods and apparatus for measuring and monitoring electric power, and more particularly to a system including sensor devices for measuring electric current.

Power distribution parameters such as power line current, power line voltage and network load distribution are useful for monitoring the efficiency of a power line distribution system. However, such information has not been available in a satisfactory manner to optimize network management. Consider power line current. The current flowing over a given power line may vary depending on the power needs of customers and the conditions of the power line network. Access to real time measurements of the current flowing through power lines at various portions of a network may allow the utility to more efficiently allocate distribution resources. However, current measurements typically have only been available at transfer substations (i.e., a location where the high voltage power lines couple to medium voltage power lines for regional power distribution) and, in some instances, at the customer's power meter. Accordingly, there is a need for measuring power line current and other parameters at many locations.

One challenge for providing such data includes difficulty in obtaining accurate current measurements. Accordingly, there is a need for a system for gathering and communicating power distribution parameters, such as power line current, power line voltage, power line power factor data, harmonic content, transient load conditions (e.g. cold-load pick-up), fault detection, and other such parameters.

Thus, a need exists for an improved sensor device, method of manufacture and use.

SUMMARY

In some embodiments a method includes receiving, from a sensor device, a signal indicative of a voltage associated with a current passing over a line that is disposed through the sensor device. The method includes receiving, from the sensor device, a signal indicative of (1) a calibrated sensitivity of the sensor device, (2) a calibrated temperature of the sensor device, and (3) an ambient temperature that was received from an ambient temperature sensor. The method includes defining an actual sensitivity of the sensor device based on (1) the calibrated sensitivity of the sensor device, (2) the calibrated temperature of the sensor device, and (3) the ambient temperature. The method includes sending a signal indicative of a modified electric current value based on (1) the voltage and (2) the actual sensitivity of the sensor device.

DETAILED DESCRIPTION

In some embodiments a method includes receiving, from a sensor device, a signal indicative of a voltage associated with a current passing over a line that is disposed through the sensor device. The method includes receiving, from the sensor device, a signal indicative of (1) a calibrated sensitivity of the sensor device, (2) a calibrated temperature of the sensor device, and (3) an ambient temperature that was received from an ambient temperature sensor. The method includes defining an actual sensitivity of the sensor device based on (1) the calibrated sensitivity of the sensor device, (2) the calibrated temperature of the sensor device, and (3) the ambient temperature. The method includes sending a signal indicative of a modified electric current value based on (1) the voltage and (2) the actual sensitivity of the sensor device.

In some embodiments, an apparatus includes a measurement module configured to be coupled to sensor device having a first sensor portion and a second sensor portion. The first sensor portion includes a first shell that includes a first printed circuit board and a second printed circuit board that (1) are operatively coupled together via a first flexible printed circuit, (2) are fully disposed within the first shell, and (3) each include a coil printed thereon. The second sensor portion includes a second shell that includes a third printed circuit board and a fourth printed circuit board that (1) are operatively coupled together via a second flexible printed circuit, (2) are fully disposed within the second shell, and (3) each include a coil printed thereon, the second sensor portion configured to be coupled to the first sensor portion to define an aperture. The apparatus includes the measurement module being operatively coupled to (1) the first sensor portion, (2) the second sensor portion, (3) an ambient temperature sensor, and (4) a memory storing a calibrated sensitivity and a calibrated temperature. The apparatus includes the measurement module being configured define a measured electric current value based on a current passing through the aperture of the sensor device. The apparatus includes the measurement module being configured to output a modified current value based on (1) the measured current value, (2) an actual sensitivity of the sensor device based on the calibrated sensitivity, and (3) an ambient temperature received from the ambient temperature sensor.

In some embodiments, an apparatus includes a sensor device having a first sensor portion, a second sensor portion, and a memory storing a sensitivity value of the sensor device, and being configured to be operatively coupled to a measurement module configured to output a modified electric current value that is based on (1) a measured current value received from the sensor device, (2) the sensitivity value of the sensor device, and (3) an ambient temperature received from a temperature sensor. The apparatus includes first sensor portion including a first shell that includes a first printed circuit board and a second printed circuit board that each include a coil printed thereon. The apparatus includes the second sensor portion including a second shell that includes a third printed circuit board and a fourth printed circuit board that each includes a coil printed thereon, the second sensor portion configured to be coupled to the first sensor portion to define an aperture.

In some embodiments, a method includes disposing a first printed circuit board into a first seat of a lower portion of a stabilizing apparatus and a second printed circuit board into a second seat, spaced apart from the first seat, of the of the lower portion of the stabilizing apparatus. The method includes advancing a flexible printed circuit through the first printed circuit board and the second printed circuit board. The method includes disposing an upper portion of the stabilizing apparatus into contact with the lower portion of the stabilizing apparatus such that the first printed circuit board is disposed in a first seat of the upper portion and the second printed circuit board is disposed in a second seat of the upper portion. The method includes attaching the first printed circuit board and the second printed circuit board to the flexible printed circuit to define a printed circuit board assembly. The method includes disposing the printed circuit board assembly within a shell to define a sensor portion of an electric current measurement device As used in this specification, the singular forms "a," "an" and "the" include plural referents unless the context clearly dictates otherwise. Thus, for example, the term "printed circuit board" is intended to mean a printed circuit board or a combination of printed circuit boards.

A power distribution network can include and/or be associated with a power line communication system and/or a power parameter measurement system. In some embodiments, power distribution parameters can be measured from multiple points along a power distribution network and transmitted to a utility or other processing center. The power parameter measurement system can include one or more sensor devices that can be positioned along overhead and/or underground medium voltage power lines, and along network (external or internal) low voltage power lines. The sensor device can measure electric current data that can be used in many ways. In an example, a power utility can monitor electric current at many locations to improve operations and maintenance, and to assist in network planning, load balancing, and build out planning. Load balancing can be performed, for example, by re-configuring switches to more efficiently distribute loads. Infrastructure build-outs can be planned based on usage patterns in specific portions of a network. Capacitor banks can be installed to optimize network performance.

In some embodiments, a sensor device can include a Rogowski coil. A Rogowski coil is an electrical device for measuring electric current (AC or pulsed). Unlike a current transformer, a Rogowski coil can have no inherent limitation in frequency or magnitude since there can be no ferrous component that can saturate. An exemplary embodiment includes first and second toroidal coils of wire (loops) electrically connected in series with each other. The first loop can be wound with a substantially constant winding density in a first direction around a core that has a substantially constant cross section. The second loop can be wound with a substantially constant winding density in a second direction around a core that has a substantially constant cross section. A conductor (e.g., a power line) whose current can be measured can traverse through the toroid. A voltage can be induced in the coil based on the rate of change of the current running through the power line. Rogowski coils may have other configurations as well.

A Rogowski coil can be open-ended and flexible, which can allow a sensor device including a Rogowski coil to be wrapped around an energized conductor. Also, a Rogowski coil can include an air core (or other dielectric core) rather than an iron core, which can give the coil a low inductance and an ability to respond to fast-changing currents. Further, the Rogowski coil typically can be highly linear, including when subjected to large currents, such as those of low voltage and medium voltage power lines. By forming the Rogowski coil with equally spaced windings, effects of electromagnetic interference can be substantially avoided. One method of providing equal spaced windings is to use printed circuit boards to manufacture the coil. Some examples of a Rogowski coil are described in U.S. Pat. No. 6,313,623 issued on Nov. 6, 2001 for "High Precision Rogowski Coil," which is incorporated herein by reference in its entirety.

As described herein, a sensor device can be configured to compensate for the variation in sensitivity due to ambient temperature. In some embodiments, the sensor device can compensate for the variation in sensitivity based on the design, based on the manufacture, and/or based on the operation. As described herein a sensor device can be calibrated (e.g., at manufacture) and a number of parameters are stored in a memory built into the sensor. In some embodiments, a sensor device can include an integrated temperature sensor to detect the ambient temperature at all times. This can reduce the effective variability due to operating temperature, from as much as a 2 or 3 percent down to less than 0.1%. In some embodiments, the memory of the sensor device can include a table or other construct in its memory that stores a plurality of temperatures and, with each temperature, an associated number that is used by the instrument to which the sensor device is attached (or other remote device) to adjust the raw measurement data supplied to that instrument by the sensor device. The number stored in association with each temperature can be determined by an algorithm used to compute the desired measured parameter(s). By storing an initial sensitivity of a sensor device, a measurement module can compensate for the variability in sensitivity due to manufacturing.

A sensor device can have at least two key performance criteria: (1) the uniformity of the sensitivity to threading current (i.e., current passing through the aperture of the sensor device) regardless of the position and orientation of the sensor on the conductor and (2) insensitivity (immunity) to fields created by external (non-threading) conductors. These two criteria can be related insofar as things that improve (or impair) uniformity also typically improve (or impair) immunity. A factor that can affect these criteria is symmetry in six degrees of freedom—two each in three directions; radial, axial, and circumferential. In monolithic (closed) Rogowski coil designs (which is to say ones that don't open at a latch and therefore require an outage, or a temporary bypass, to install them), there is generally an outbound loop and no need for a return wire or loop, thus imbuing them, if carefully wound, with very good symmetry on all counts.

In separable designs, for example, similar to those embodiments described herein, a return wire or counter-propagating loop is needed. This return wire or counter-propagating loop that can introduce considerable asymmetry, usually owing to the sheer thickness of wires passing over each other in the case of a counter-propagating loop return or the imprecision of a return wire running (ideally but not exactly) down the center of the outbound loop. In some embodiments described herein, printed circuit board assemblies can be manufactured in such a way as to maximize symmetry in conjunction with the design of a housing (shell) of the printed circuit board assemblies.

Another source of error with separable Rogowski coils (be they hinged with a latch, flexible with a latch, or disjoint with a latch) is the asymmetries introduced by the hinges, latches, and other interfaces. In other words, as a coil comes to the end of the line, there can be a physical structure that interrupts its axial symmetry. This is universally the case with continuous (which is to say, not discretized) coils. These errors can be as large as 10 to 15% in some cases. As described herein, embodiments of the present invention can utilize an "egg-tooth" hinge and a "saddle" latch (coupler) to promote precision in the physical/geometric proximity of one half of the sensor device to the other. The discretization of the sensitive parts of the design (the PCBs) allows for a natural interstitial place for a hinge and latch to be incorporated, without interruption to symmetry in any degree of freedom.

As described herein, a sensor device can use a commodity (USB or similar shielded twisted pair) cable as a means of bringing the sensor output signal (which can be small relative to that of a current transformer) to the measurement module. This cable can be a small gage shielded twisted pair which proves to provide resistanance to interference from electromagnetic and electrostatic fields typical in power systems metrology.

As described herein, the method of measuring current can include modifying the measured electric current based on ambient temperature. This can assume that the temperature response of the sensor device is linear. Other means of compensating are also contemplated, such as a lookup table or a higher order formula which would better compensate for sensors that have a nonlinear, or even arbitrary, temperature response.

In the following description, for purposes of explanation and not limitation, specific details are set forth, such as particular networks, communication systems, computers, terminals, devices, components, techniques, data and network protocols, power line communication systems (PLCSs), software products and systems, enterprise applications, operating systems, development interfaces, hardware, etc. in order to provide a thorough understanding of the present invention.

It will be apparent to one skilled in the art that the present invention may be practiced in other embodiments that depart from these specific details. Detailed descriptions of well-known networks, communication systems, computers, terminals, devices, PLCSs, components, techniques, data and network protocols, software products and systems, operating systems, development interfaces, and hardware are omitted so as not to obscure the description of the present invention.

Figure 1:
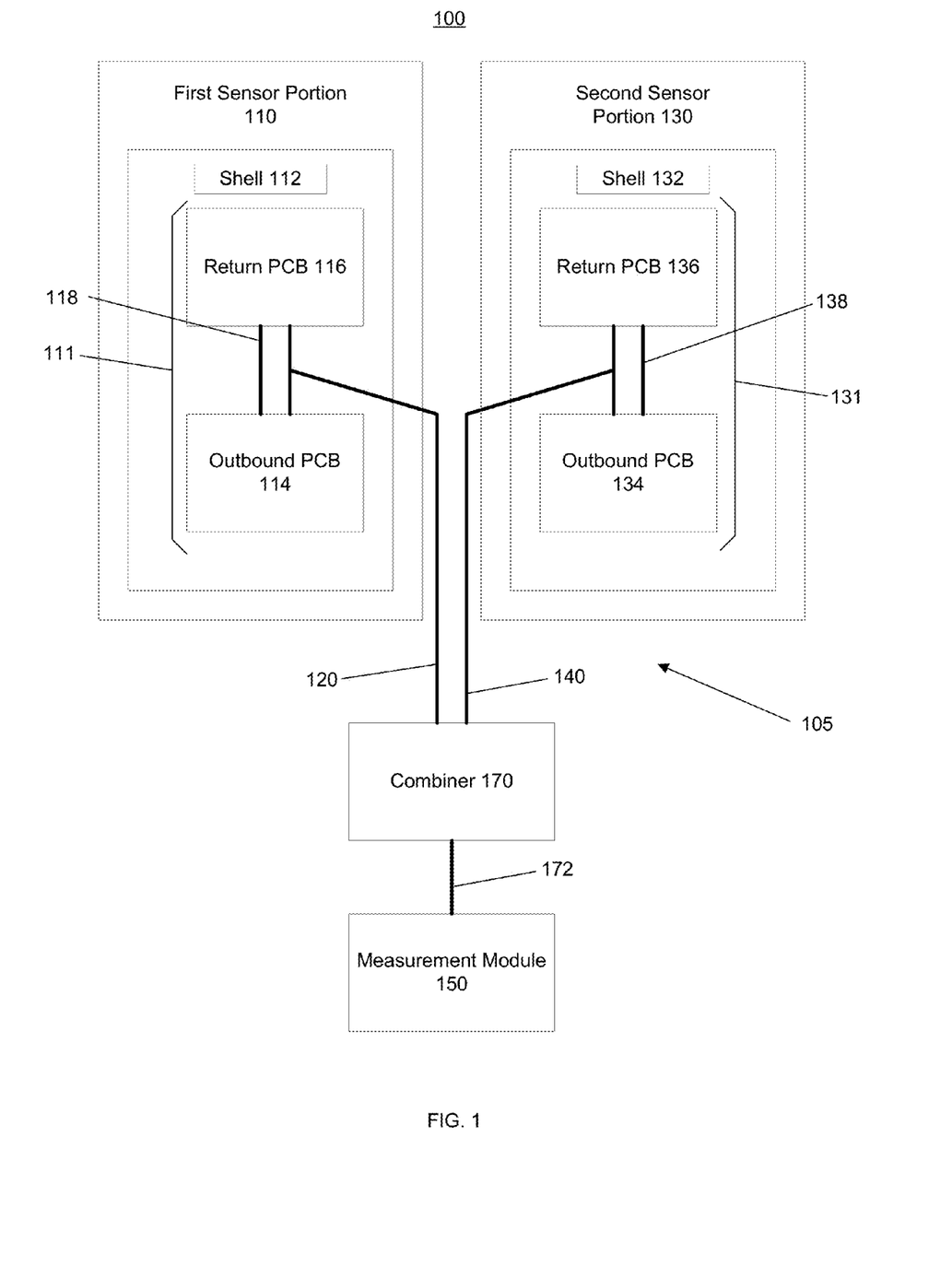
FIG. 1 is a schematic block diagram a measurement system according to an embodiment.

FIG. 1 is a schematic illustration of measurement system 100 that includes a sensor device 105 and a measurement module 150 according to an embodiment. As shown in FIG. 1, sensor device 105 includes a first sensor portion 110, a second sensor portion 130 and a combiner 170. First sensor portion 110 of sensor device 105 includes a shell 112 and a printed circuit board assembly 111 that includes an outbound printed circuit board 114, a return printed circuit board 116 and flexible printed circuit 118. Second sensor portion 130 of sensor device 105 includes a shell 132 and a printed circuit board assembly 131 that includes an outbound printed circuit board 134, a return printed circuit board 136 and flexible printed circuit 138. In some embodiments, sensor device 105 can include and/or be operatively coupled to an ambient temperature sensor (not shown).

Sensor device 105 includes first sensor portion 110 that is configured to measure a current based on voltage induced in first sensor portion 110. First sensor portion 110 includes shell 112 and printed circuit board assembly 111. Shell 112 can be substantially semi-toroidal in shape. Shell 112 can include a first half shell (not shown) and a second half shell (not shown). The first half shell can include seats for outbound printed circuit board 114 and return printed circuit board 116 and can be configured to prevent and/or otherwise reduce potential movement of outbound printed circuit board 114 and return printed circuit board 116 within shell 112. For example, the seats of the first half shell can include walls that can align and/or otherwise locate a printed circuit board within shell 112 and with respect to other printed circuit boards within shell 112. Similar to the first half shell, the second half shell can include seats for outbound printed circuit board 114 and return printed circuit board 116 configured to prevent and/or otherwise reduce a movement of outbound printed circuit board 114 and return printed circuit board 116 within shell 112. For example, the seats of the second half shell can include walls that can align and/or otherwise locate a printed circuit board within shell 112 and with respect to other printed circuit boards within shell 112. In some embodiments, an interior of shell 112 can include a coated conductive material that is configured to increase resistance and/or immunity to electrostatic fields.

Shell 112 of sensor device 105 includes printed circuit board assembly 111 that includes outbound printed circuit board 114 and return printed circuit board 116. Outbound printed circuit board 114 and return printed circuit board 116 can be electrically coupled to operate as a multi-layer printed circuit board. In some embodiments, outbound printed circuit board 114 and return printed circuit board 116 can be spaced apart within shell 112. In this manner, outbound printed circuit board 114 and return printed circuit board 116 can be a discretized multi-layer printed circuit board. Each of outbound printed circuit board 114 and return printed circuit board 116 can include coils (now shown), for example, a coil on each side of outbound printed circuit board 114 and each side of return printed circuit board 116. Specifically, outbound printed circuit board 114 can include coils from the outbound loop of the Rogowski coil, and return printed circuit board 116 can include coils from the counter-propagating (return) loop of the Rogowski coil. In some embodiments, the coils can be photolithographically printed onto a first face and a second face, respectively, of each of outbound printed circuit board 114 and return printed circuit board 116. Including an outbound printed circuit board 114 and a return printed circuit board 116, can reduce the influence of asymmetry on the accuracy of a measurement. Outbound printed circuit board 114 and return printed circuit board 116 can be operatively coupled to each other, and to measurement module 150 via flexible printed circuit 118. In some embodiments the twist of the coil in the spaces between the outbound printed circuit board 114 and return printed circuit board 116 is alternated in order to reduce the sensitivity which can reduce the influence due to asymmetry.

As described above, each of outbound printed circuit board 114 and return printed circuit board 116 can include a first coil and a second coil (e.g. one on each side/face of the printed circuit board). In some embodiments, the first coil and the second coil can be a set of coaxial spiral planar coils (e.g., an inductor). In this manner, each layer of the multilayer printed circuit board that includes outbound printed circuit board 114 and return printed circuit board 116 includes an inductor. While shown in FIG. 1 as including two layers (printed circuit boards 114, 116), in some embodiments, first sensor can include more or fewer layers. In such embodiments, more layers can provide greater sensitivity. In one example, a first sensor portion can include 12 layers. In such an example, the first sensor portion can include 6 outbound printed circuit boards 114 alternating with 6 return printed circuit boards 116. In such an example, the number of layers (e.g., the total number of printed circuit boards 114, 116) is even so that there are an equal number of "outbound" and "return" coils. In such an example, the outbound coils can be on the odd layers and the return coils can be on the even layers, although this can be reversed without penalty. In this manner, first sensor portion 112 can include axial symmetry.

Sensor device 105 includes second sensor portion 130 that is configured to measure a current based on voltage induced in second sensor portion 130. Second sensor portion 130 can be substantially similar to first sensor portion 110 and can include substantially similar components. For example, second sensor portion 130 includes shell 132, and printed circuit board assembly 131 that includes outbound printed circuit board 134, return printed circuit board 136, and flexible printed circuit 138. As described above, first sensor portion 110 can include more or fewer outbound and printed circuit boards. In such embodiments, second sensor portion 130 can include the same number and orientation of outbound and return printed circuit boards.

First sensor portion 110 can be mechanically coupled to second sensor portion 130 independent of an electrical coupling between first sensor portion 110 and second sensor portion 130. Furthermore, a proximal end (not shown) of first sensor portion 110 can be mechanically coupled to a proximal end (not shown) of second sensor portion 130 independent of and/or in conjunction with a distal end (not shown) of first sensor portion 110 being mechanically coupled to a distal end (not shown) second sensor portion 130. A mechanical coupling between first sensor portion 110 and second sensor portion 130 can be permanent or selective. In some embodiments, the proximal end of first sensor portion 110 can be selectively mechanically coupled to the proximal end of second sensor portion 130 via a plug and socket interface and a coupler (not shown), and distal end of first sensor portion 110 can be selectively mechanically coupled to the distal end of second sensor portion 130 via a hinge, specifically an "egg-tooth" hinge (see, e.g. FIG. 3). Such an embodiment can be referred to as a disjoint sensor, e.g. two halves (first sensor portion 110 and second sensor portion 130) are totally separable, tethered only by cables connected to each half. The egg-tooth hinge and plug and socket interface can allow the two halves to mate without increasing the girth of either end of either half. In this manner, installation in tight quarters can be easier, for example, by allowing one half of the sensor to pass between cables or bus-bars that are very close (e.g., as close as 15 mm or less) and/or immovable.

Sensor device 105 can include the coupler (not shown), for example a saddle clamp, to couple first sensor portion 110 to second sensor portion 130. In some embodiments, the coupler can include at least one aperture (not shown) corresponding to at least one post (not shown) on each of shells 112, 132. In such embodiments, the coupler can be positioned onto first sensor portion 110 and second sensor portion 130 such that the at least one post is positioned in the at least one aperture. In some embodiments, cables (not shown) configured to electrically couple flexible printed circuit board 118 to measurement module 150 and flexible printed circuit board 138 to measurement module 150 can pass through the at least one aperture. In this manner, the coupler can be secured to other components of sensor device 105. In some embodiments, shell 112 can include a semi-toroidal shape, and shell 132 can include a semi-toroidal shape. In such embodiments, shell 112 can be coupled, for example, via the coupler and the egg-tooth hinges, to shell 132 to define a toroidal shape.

Sensor device 105 includes combiner 170 configured to combine signals received from a first sensor cable 120 that is operatively coupled to printed circuit board assembly 111 and from a second sensor cable 140 that is operatively coupled to printed circuit board assembly 131. Combiner 170 is configured to output the combined signal via output cable 172 and to measurement module 150.

Sensor device 105 can include a temperature sensor (not shown) and a memory (not shown). The temperature sensor can measure an ambient temperature associated with sensor device 105 and can be configured to communicate ambient temperature values with the measurement module 150. The memory can include a computer processor and/or memory, for example a random access memory (RAM), a memory buffer, a hard drive, a database, an erasable programmable read-only memory (EPROM), an electrically erasable read-only memory (EEPROM), and/or so forth. The memory can store a calibrated sensitivity ("Sc") for sensor device 105, a calibration ambient temperature ("Tc") for sensor device 105, and/or a temperature slope ("St") of the sensor device 105. In some embodiments, the temperature sensor and the memory can be a 1-wire devices (for example, a 1-wire device manufactured by Maxim®). In some embodiments, the temperature sensor and/or the memory of the sensor device can be included in combiner 170. In other embodiments, the temperature sensor and/or the memory of the sensor device can be disposed downstream of combiner 170.

Measurement system 100 includes measurement module 150 that is configured to measure a current that passes through sensor device 105, specifically that passes between first sensor portion 110 and second sensor portion 130. Measurement module 150 can include a computer processor and/or memory, for example a random access memory (RAM), a memory buffer, a hard drive, a database, an erasable programmable read-only memory (EPROM), an electrically erasable read-only memory (EEPROM), and/or so forth. The measurement module can be configured to execute measurement process and/or program. The measurement process and/or program can include defining an initial electric current measurement based on signals received from first sensor portion 110 and from second sensor portion 130, and can include defining an adjusted/modified current measurement based on the initial electric current measurement and the actual sensitivity of sensor device 105. In such embodiments, the actual sensitivity ("Sa") of the sensor device 105 can be based on the calibrated sensitivity for sensor device 105, the ambient temperature during calibration for sensor device 105, the temperature slope of the sensor device 105, and/or a current ambient temperature ("Tm"). In some embodiments, the ambient temperature can be received from the ambient temperature sensor. In some embodiments, the actual sensitivity of sensor device 105 can be based on the formula: Sa=Sc+(St*(Tm−Tc)). In this manner, the actual sensitivity of sensor device 105 can change depending on the current ambient temperature.

Measurement module 150 can include and/or otherwise be associated with an analog-to-digital converter (not shown) configured to convert an analog voltage signal received from sensor device 105 to a digital signal, for example to a digital signal indicative of a current. The analog-to-digital converter can be configured to receive and/or otherwise retrieve the actual sensitivity of sensor device 105 and can base the analog-to-digital conversion, at least in part, on the actual sensitivity of sensor device 105. In this manner, as the actual sensitivity of sensor device 105 changes, for example, based on the current ambient temperature, the output of measurement module 150, for example, the modified electric current, can change.

Figure 2:
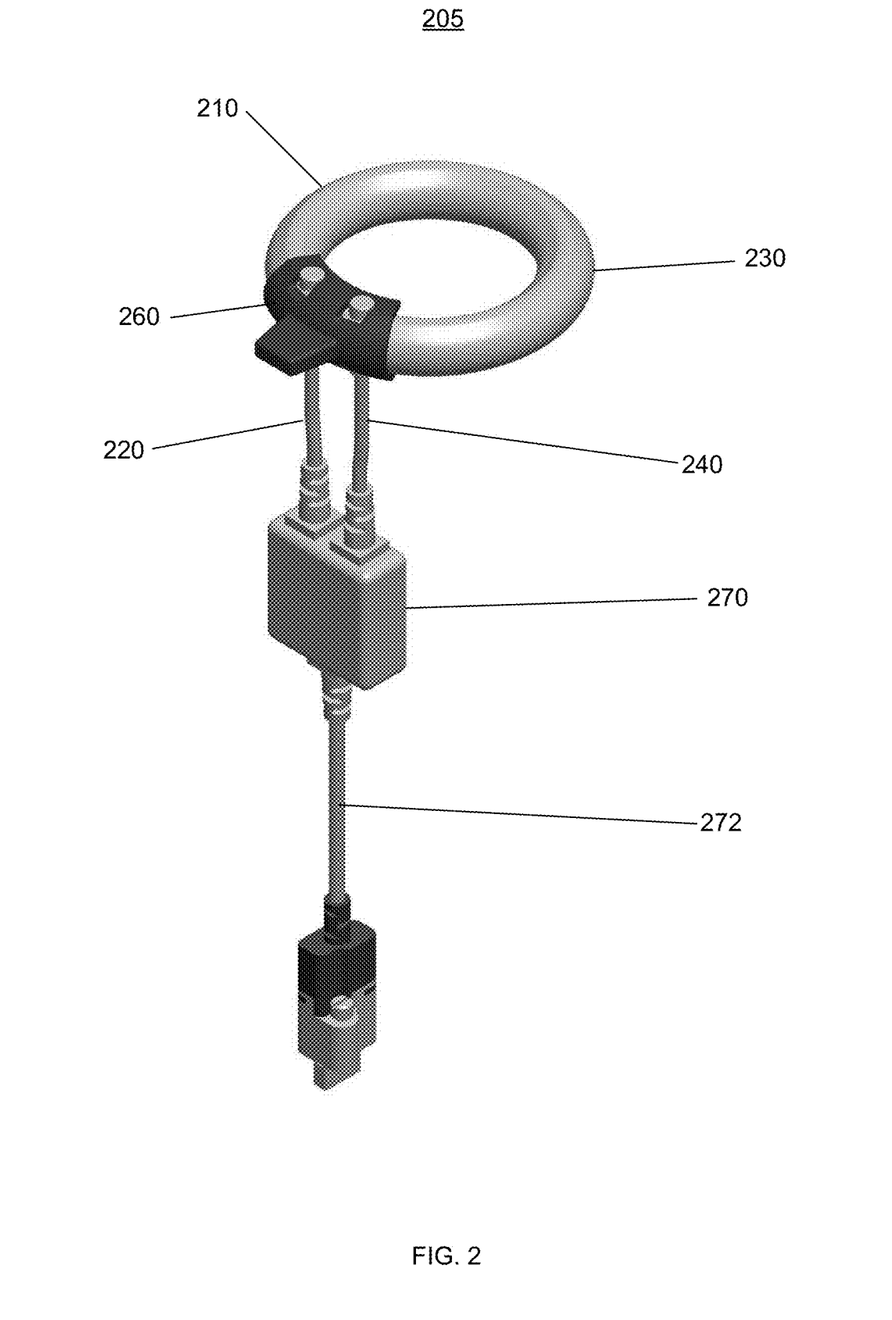
FIG. 2 is an illustration of a perspective view of a sensor device from a measurement system according to an embodiment.

FIG. 2 depicts a sensor device 205 according to an embodiment. Sensor device 205 can be similar to sensor device 105 and can include similar components having similar characteristics. For example, sensor device 205 includes a first sensor portion 210 which is similar to first sensor portion 110 of sensor device 105. As shown in FIG. 2, sensor device 205 includes first sensor portion 210, a second sensor portion 230, a first sensor cable 220, a second sensor cable 240, a coupler 260, and a combiner 270 that includes an output cable 272. Sensor device 205 can communicate with a measurement module (not shown).

Figure 3:
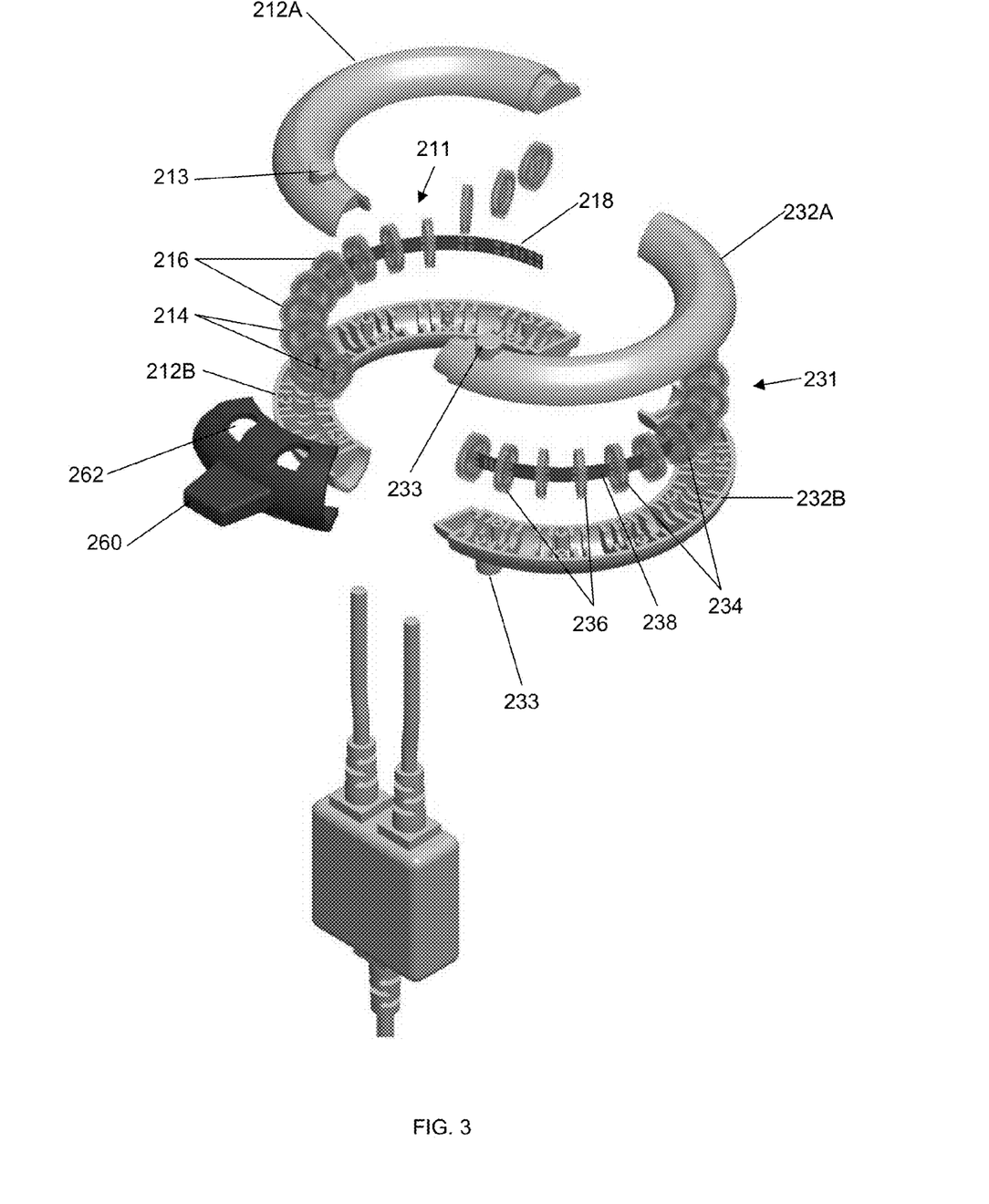
FIG. 3 is an illustration of an exploded perspective view of the sensor device depicted in FIG. 2.

FIG. 3 depicts an exploded view of sensor device 205. As shown in FIG. 3, first sensor portion 210 includes a first half shell 212A and a second half shell 212B. First sensor portion 210 includes printed circuit board assembly 211 that includes six outbound printed circuit boards 214, six return printed circuit boards 216, and a flexible printed circuit 218. As shown in FIG. 3, second sensor portion 230 includes a first half shell 232A and a second half shell 232B. Second sensor portion 230 includes printed circuit board assembly 231 that includes six outbound printed circuit boards 234, six return printed circuit boards 236, and a flexible printed circuit 238. As shown in FIG. 3, coupler 260 includes apertures 262 configured to receive posts 213 and posts 233.

Figure 4A:
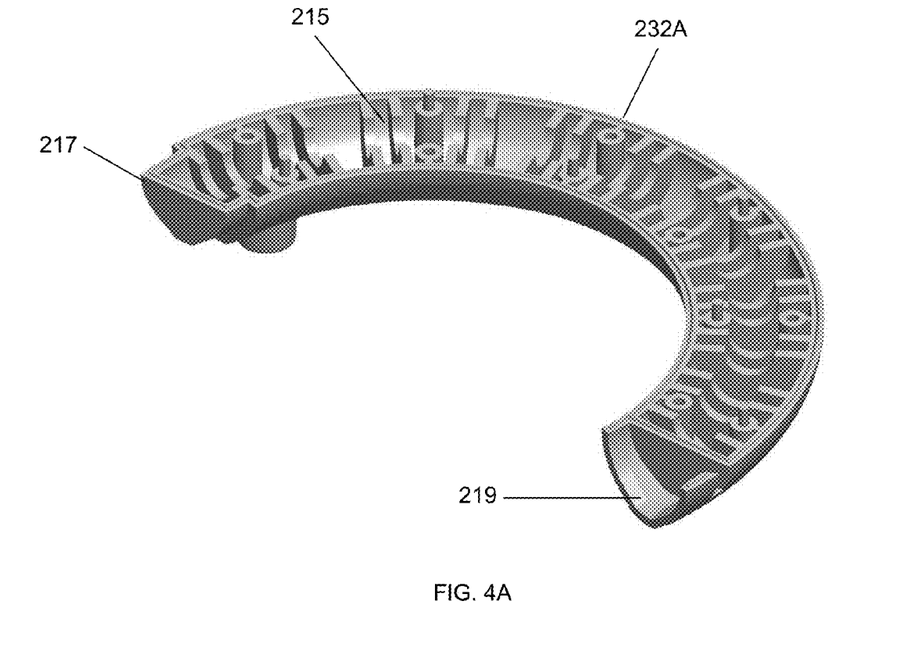
FIG. 4A is an illustration of a portion of the sensor device depicted in FIG. 2.
Figure 4B:
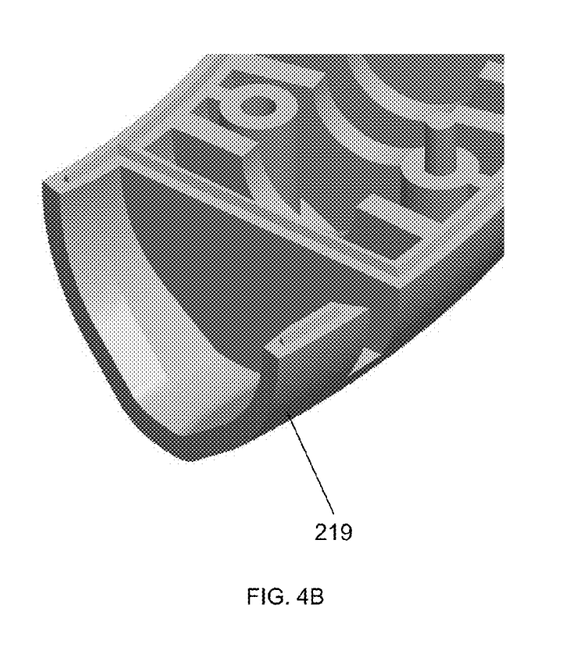
FIG. 4B is an illustration of a close-up view of the portion depicted in FIG. 4A.

FIG. 4A depicts first half shell 232A of second sensor portion 230 of sensor device 205, and FIG. 4B depicts a portion of first half shell 232A. As shown in FIGS. 4A and 4B, first half shell 232A includes a set of seats 215, similar to the seats described above with respect to sensor 105, and configured to receive outbound printed circuit boards 234 and return printed circuit boards 236. First half shell 232A includes plug and socket interface portion 217 and an egg-tooth connection portion 219. First half shell 212A, second half shell 232B and second half shell 212B can be similar to second half shell 232B, with different orientations.

Figure 5:
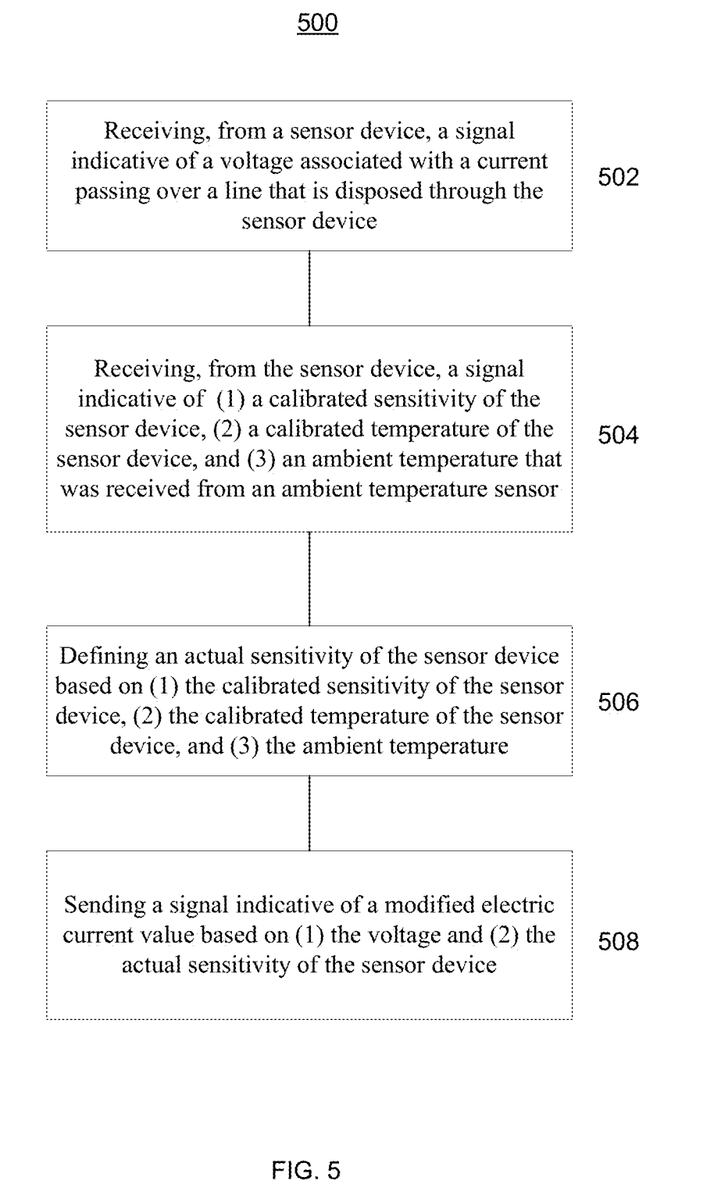
FIG. 5 is a flow chart illustrating a method of operating a measurement system according to an embodiment.

FIG. 5 is a flow chart depicting a method 500 of using a sensor device according to an embodiment. The method 500 includes receiving, from a sensor device, a signal indicative of a voltage associated with a current passing over a line that is disposed through the sensor device, at 502. The method includes receiving, from the sensor device, a signal indicative of (1) a calibrated sensitivity of the sensor device, (2) a calibrated temperature of the sensor device, and (3) an ambient temperature that was received from an ambient temperature sensor, at 504. The method 500 includes defining an actual sensitivity of the sensor device based on (1) the calibrated sensitivity of the sensor device, (2) the calibrated temperature of the sensor device, and (3) the ambient temperature, at 506. The method 500 includes sending a signal indicative of a modified electric current value based on (1) the voltage and (2) the actual sensitivity of the sensor device.

In an example, with respect to FIGS. 2, 3, 4A and 4B, electric current flowing over a line of a power distribution system can be measured as follows. In the example, when sensor device 205 is manufactured, for example, as described herein, sensor device can be calibrated. During the calibration process, characteristics of sensor device 205 can be stored in the memory of sensor device 205, for example, the calibrated sensitivity ("Sc") of sensor device 205, the temperature at which sensor device 205 was calibrated ("Tc"), and the temperature slope of the sensor device 205 ("St"). In the example, sensor device 205 can be installed about the line to be measured. In some embodiments, sensor device 205 can be installed and left in place for periodic measurements over time. Sensor device 205 can receive a signal from a measurement module, (e.g., can be polled), to send a measured electric current value. In the example, the electric current flowing through the line, and subsequently through an aperture of sensor device 205 can induce a voltage in the coils of printed circuit assemblies 211, 231 and can be measured by the measurement device via first sensor cable 220 and second sensor cable 240 as combined via combiner 270. In the example, the measurement module can retrieve from and/or otherwise receive, the Sc, Tc, and St of sensor device 205, via a memory of sensor device 205. In the example, the measurement module can retrieve from and/or otherwise receive from the sensor device and/or an associated temperature sensor, the ambient temperature of and/or around sensor device 205. In the example, the measurement module can define a modified electric current value passing through sensor device 205 based on (1) an actual sensitivity of sensor device 205, that is based on the Sc, Tc and St, (2) on the ambient temperature, and (3) the measured electric current.

Figure 6A:
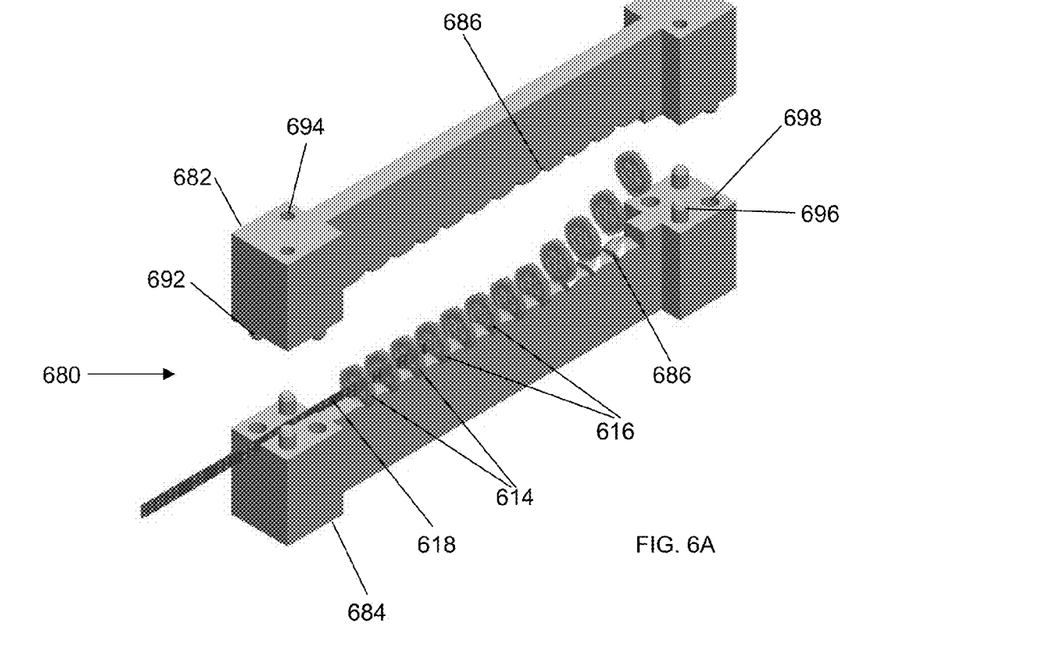
FIG. 6A is an illustration of a view of a stabilizer apparatus for a sensor device according to an embodiment.
Figure 6B:
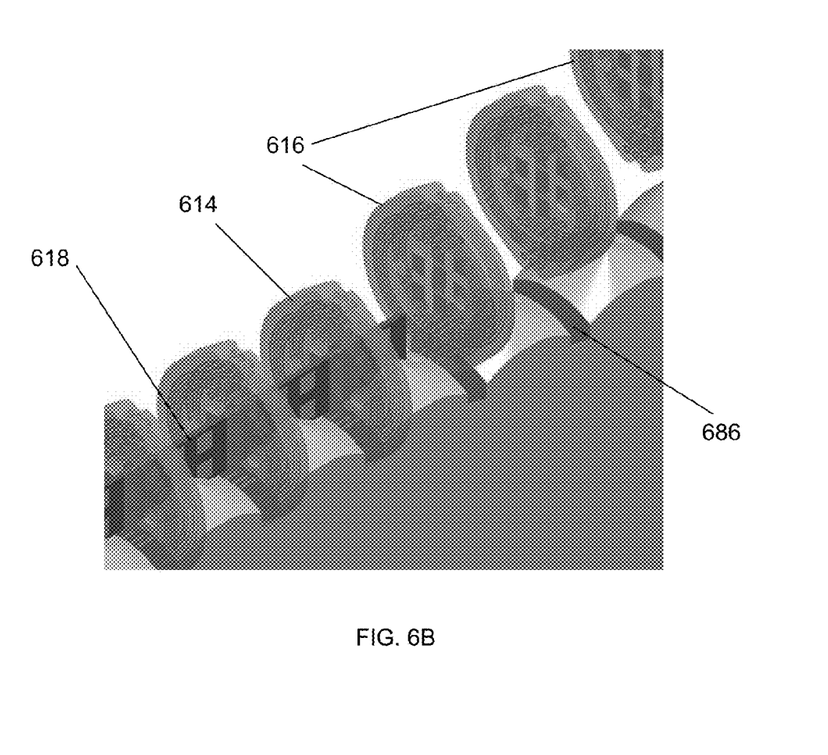
FIG. 6B is an illustration of a close-up view of the stabilizer apparatus depicted in FIG. 6A.

FIG. 6A depicts an stabilizer apparatus 680 for assembling a printed circuit board assembly 611 that is similar to the printed circuit board assembly 111 of sensor device 105 and printed circuit board assembly 211 of sensor device 205. Stabilizer apparatus 680 includes a top portion 682 and a bottom portion 684. Each of top portion 682 and bottom portion 684 includes sets of seats 686 for receiving sets of outbound printed circuit boards 614 and return printed circuit boards 616. As shown in FIG. 6A, top portion 682 includes posts 692 and apertures 694 corresponding to posts 696 and apertures 698 of bottom portion 684.

In one example, with respect to FIG. 6A, a method of manufacturing a sensor device can include printing a coil on each side of a set of outbound printed circuit boards 614 and on each side of a set of return printed circuit boards 616. The method can include alternatively disposing outbound printed circuit boards 614 and return printed circuit boards 616 into seats 686 of bottom portion 684. The method can include advancing a flexible printed circuit 618 through the alternatively disposed set of outbound printed circuit boards 614 and set of return printed circuit boards 616. The method can include coupling top portion 682 with bottom portion 684 such that outbound printed circuit boards 614 and return printed circuit boards 616 are disposed in seats 686 of top portion 682, and such that posts 692 are disposed within apertures 698, and such that posts 696 are disposed with apertures 694. The method can include welding/soldering outbound printed circuit boards 614 and return printed circuit boards 616 to flexible printed circuit 618 to define a first printed circuit board assembly. The method can include defining a second printed circuit board assembly in a similar manner.

Continuing with the example, the method can include disposing the first printed circuit board assembly in a first half shell of a first sensor portion. The method can include disposing a first sensor cable through a first aperture of a coupler, through a post in the first half shell of the first sensor and electrically coupling the first sensor cable to flexible printed circuit 618. The method can include disposing a second half shell of the first sensor portion into contact with the first half shell of the first sensor portion. In some embodiments, the method can include welding, for example ultrasonically welding, the first half shell of the first sensor portion to the second half shell of the second sensor portion. The method can include assembling a second sensor portion in a similar manner. A sensor device assembled as described above can include at least two configurations. When in a first configuration, the first sensor portion can be separated from the second sensor portion, and the coupler can be decoupled from the first sensor portion and the second sensor portion. When the in the first configuration, the sensor device can be disposed about a line that is configured to have a current. When in the second configuration, the first sensor portion can be coupled to the second sensor portion, for example, a distal end of the first sensor portion and a distal end of the second sensor portion can be in contact with each other (e.g., egg-tooth hinge), and a proximal end of the first sensor portion and a proximal end of the second sensor portion can be in contact with each other (e.g., plug and socket interface). Furthermore, when in the second configuration, a coupler can be disposed over the plug and socket interface of the proximal ends of the first sensor portion and the second sensor portion. When in the second configuration, the sensor device can measure a current over a line and/or an ambient temperature.

Figure 7:
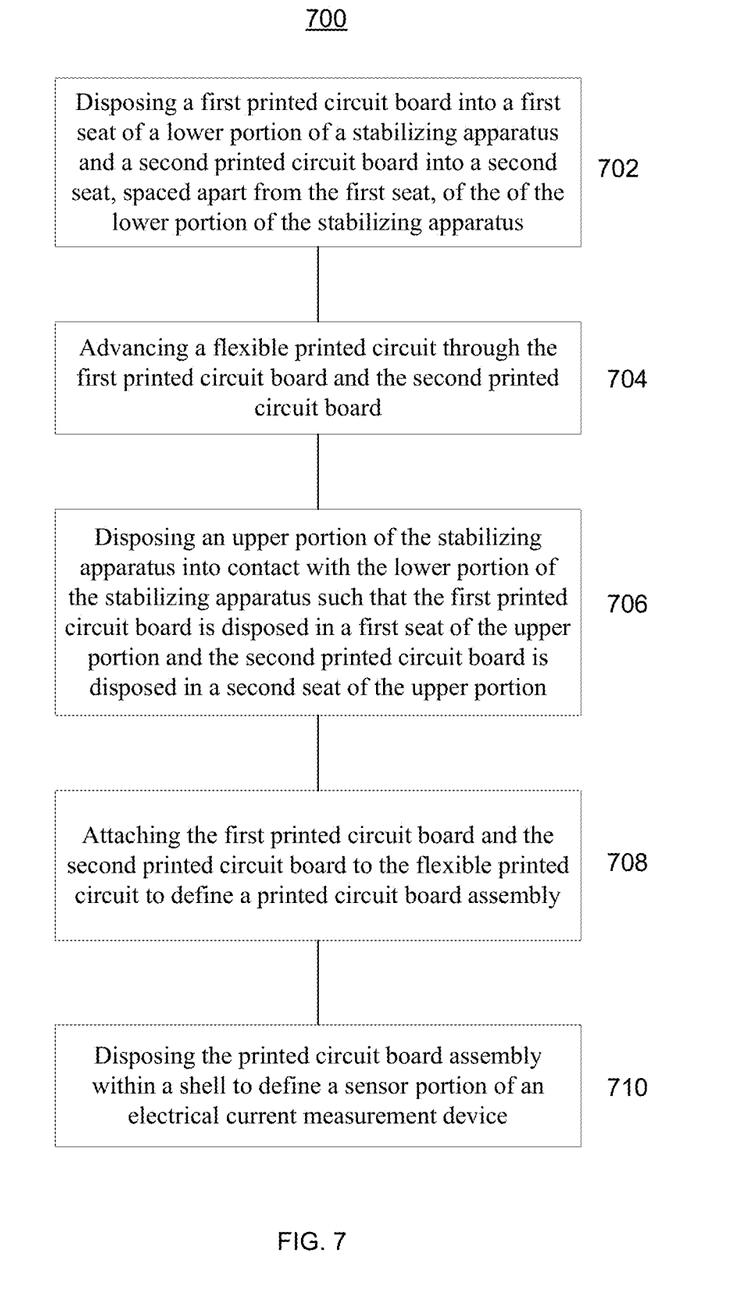
FIG. 7 is a flow chart illustrating a method of manufacturing a sensor device according to an embodiment.

FIG. 7 is a flow chart depicting a method 700 of manufacturing a portion of a sensor device according to an embodiment described herein. The method 700 includes disposing a first printed circuit board into a first seat of a lower portion of a stabilizing apparatus and a second printed circuit board into a second seat, spaced apart from the first seat, of the of the lower portion of the stabilizing apparatus, at 702. The method 700 includes advancing a flexible printed circuit through the first printed circuit board and the second printed circuit board, at 704. The method 700 includes disposing an upper portion of the stabilizing apparatus into contact with the lower portion of the stabilizing apparatus such that the first printed circuit board is disposed in a first seat of the upper portion and the second printed circuit board is disposed in a second seat of the upper portion, at 706. The method 700 includes attaching the first printed circuit board and the second printed circuit board to the flexible printed circuit to define a printed circuit board assembly, at 708. The method 700 includes disposing the printed circuit board assembly within a shell to define a sensor portion of an electric current measurement device.

Figure 8:
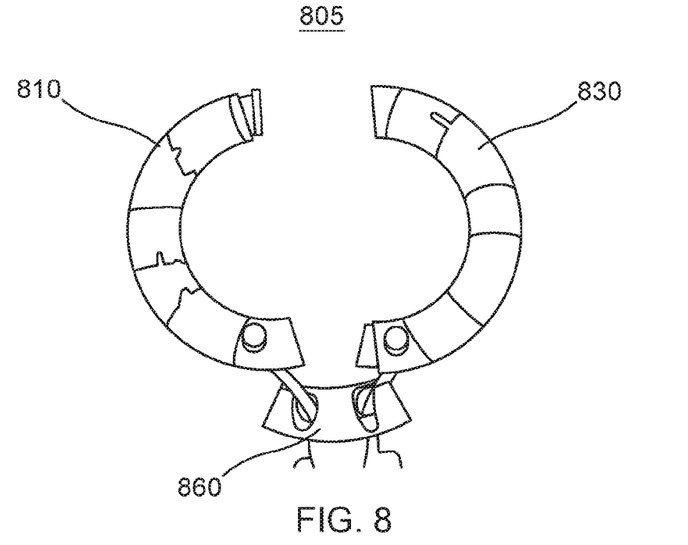
FIG. 8 is an illustration of sensor device according to an embodiment.

FIG. 8 is an illustration of a sensor device 805 in a first configuration. Sensor device 805 can be similar to sensor device 105 and can include similar components having similar characteristics. For example a first sensor portion 810 can be similar to first sensor portion 110. As shown in FIG. 8, sensor 805 includes the first sensor portion 810, a second sensor portion 830 and a coupler 860.

Figure 9:
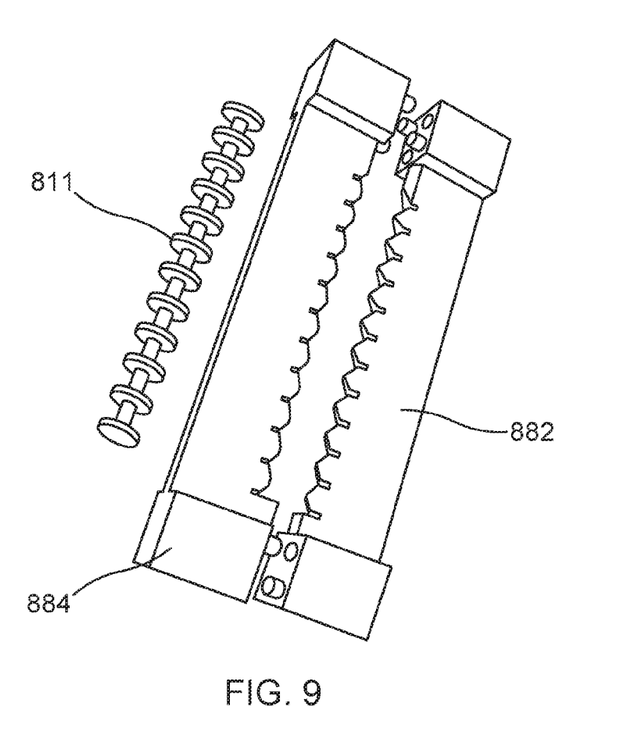
FIG. 9 is an illustration of a stabilizer apparatus and portion of a sensor device according to an embodiment.

FIG. 9 is an illustration of a stabilizer apparatus 880 for manufacturing a portion of a sensor device. Stabilizer apparatus 880 can be similar to stabilizer apparatus 680 and can include similar component having similar characteristics. For example a first portion 882 can be similar to first portion 682. As shown in FIG. 9, a stabilizer apparatus can include the top portion 882 and a bottom portion 884. The stabilizer apparatus can be used to manufacture a printed circuit board assembly 811.

Some embodiments described herein relate to a computer storage product with a computer-readable medium (also can be referred to as a processor-readable medium) having instructions or computer code thereon for performing various computer-implemented operations. The media and computer code (also can be referred to as code) may be those designed and constructed for the specific purpose or purposes. Examples of computer-readable media include, but are not limited to: magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), and Read-Only Memory (ROM) and Random-Access Memory (RAM) devices.

Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using Java, C++, or other programming languages (e.g., object-oriented programming languages) and development tools. Additional examples of computer code include, but are not limited to, control signals, encrypted code, and compressed code.

While various embodiments have been described above, it should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described. By way of example while an outbound printed circuit board and return printed circuit board are shown and/or described as being two separate printed circuit boards, in some embodiments, the outbound coil and return coil can be consolidated into a single printed circuit board which can reduce the number of unique components to the system and can improve accuracy. In such embodiments, a 12 layer circuit board can be achieved with 6 outbound coil and 6 return coils.

Where methods described above indicate certain events occurring in certain order, the ordering of certain events can be modified. Additionally, certain of the events can be performed concurrently in a parallel process when possible, as well as performed sequentially as described above. Any portion of the apparatus and/or methods described herein may be combined in any combination, except mutually exclusive combinations.

What is claimed:

1. An apparatus, comprising: a measurement module configured to be coupled to a sensor device having a first sensor portion and a second sensor portion, the first sensor portion comprising a first shell that includes a first printed circuit board and a second printed circuit board distinct from the first printed circuit board, the first printed circuit board and the second printed circuit board (1) operatively coupled together via a first flexible printed circuit, (2) fully disposed within the first shell, and (3) each include a coil printed thereon, the second sensor portion comprising a second shell that includes a third printed circuit board and a fourth printed circuit board that (1) are operatively coupled together via a second flexible printed circuit, (2) are fully disposed within the second shell, and (3) each include a coil printed thereon, the second shell of the second sensor portion configured to be coupled to the first shell of the first sensor portion to define a single aperture, the measurement module operatively coupled to (1) the first sensor portion, (2) the second sensor portion, (3) an ambient temperature sensor, and (4) a memory storing a calibrated sensitivity and a calibrated temperature; the measurement module configured to define a measured electric current value based on a current passing through the aperture of the sensor device, and the measurement module configured to output a modified current value based on (1) the measured current value, (2) an actual sensitivity of the sensor device based on the calibrated sensitivity, and (3) an ambient temperature received from the ambient temperature sensor, wherein the first shell is semi-toroidal, the second shell is semi-toroidal, and the second shell of the second sensor portion is configured to be coupled to the first shell of the first sensor portion to form a single toroid that defines the aperture.

2. The apparatus of claim 1, wherein the measurement module is configured to send a signal configured to cause the sensor device to define a value indicative of a measured electric current.

3. The apparatus of claim 1, wherein the actual sensitivity is based on the calibrated sensitivity and the calibrated temperature.

4. The apparatus of claim 1, wherein the measurement module is configured to be operatively coupled to the memory storing a temperature characteristic of the sensor device, the actual sensitivity is based on the calibrated sensitivity and the temperature characteristic.

5. An apparatus, comprising: a sensor device having a first sensor portion, a second sensor portion, and a memory storing a sensitivity value of the sensor device, and being configured to be operatively coupled to a measurement module configured to output a modified electric current value that is based on (1) a measured current value received from the sensor device, (2) the sensitivity value of the sensor device, and (3) an ambient temperature received from a temperature sensor; the first sensor portion comprising a first shell that includes a first printed circuit board and a second printed circuit board that are distinct from one another, each of the first printed circuit board and the second printed circuit board including a coil printed thereon; the second sensor portion comprising a second shell that includes a third printed circuit board and a fourth printed circuit board that each include a coil printed thereon, the second shell of the second sensor portion configured to be coupled to the first shell of the first sensor portion to form a single toroid that defines a single aperture.

6. The apparatus of claim 5, wherein the first shell includes a receiver portion of a first egg-tooth hinge and an insert portion of a second egg-tooth hinge, and the second shell includes an insert portion of the first egg-tooth hinge and a receiver portion of the second egg-tooth hinge.

7. The apparatus of claim 5, wherein the first shell includes a top half shell and a bottom half shell, each of the top half shell and the bottom half shell including a first seat configured to receive the first printed circuit board and a second seat configured to receive the second printed circuit board.

8. The apparatus of claim 5, wherein an interior of the first shell is coated with conductive material.

9. The apparatus of claim 5, wherein the first printed circuit board is operatively coupled to the second printed circuit board via a flexible printed circuit.

10. The apparatus of claim 5, wherein the first printed circuit board includes an outbound Rogowski coil and the second printed circuit board includes a return Rogowski coil.

11. The apparatus of claim 5, further comprising a combiner housing operatively coupled to the first sensor portion and the second sensor portion and including the temperature sensor and the memory.

12. A method, comprising: receiving, from a sensor device configured as a first shell portion and a second shell portion, when coupled, form single toroid that defines a single aperture, a signal indicative of a voltage associated with a current passing over a line that is disposed through the single aperture of the sensor device; receiving, from the sensor device, a signal indicative of (1) a calibrated sensitivity of the sensor device, (2) a calibrated temperature of the sensor device, and (3) an ambient temperature that was received from an ambient temperature sensor; defining an actual sensitivity of the sensor device based on (1) the calibrated sensitivity of the sensor device, (2) the calibrated temperature of the sensor device, and (3) the ambient temperature; and sending a signal indicative of a modified electric current value based on (1) the voltage and (2) the actual sensitivity of the sensor device.

13. The method of claim 12, wherein defining an actual sensitivity of the sensor device is further based on a temperature characteristic of the sensor device.

14. The method of claim 12, wherein the voltage is based on a rate of change in the current passing over the line.

15. The method of claim 12, further comprising wherein receiving a signal indicative of a calibrated sensitivity includes receiving a signal indicative of a calibrated sensitivity that is stored in a lookup table of a memory of the sensor device.

16. An apparatus, comprising: a measurement module configured to be operatively coupled to sensor device having a first sensor portion and a second sensor portion, the first sensor portion comprising a first shell that includes a first printed circuit board and a second printed circuit board distinct from the first printed circuit board, the first printed circuit board and the second printed circuit board (1) operatively coupled together via a first flexible printed circuit, (2) fully disposed within the first shell, and (3) each include a coil printed thereon, the second sensor portion comprising a second shell and that is configured to be coupled to the first shell of the first sensor portion to define a single aperture, the measurement module operatively coupled to (1) an ambient temperature sensor, and (2) a memory storing a calibrated sensitivity and a calibrated temperature; the measurement module configured define a measured electric current value based on a current passing through the aperture of the sensor device, the measurement module configured to output a modified current value based on (1) the measured current value, (2) an actual sensitivity of the sensor device based on the calibrated sensitivity, and (3) an ambient temperature received from the ambient temperature sensor, and the measurement module configured to send a signal configured to cause the sensor device to define a value indicative of a measured electric current, wherein the first shell is semi-toroidal, the second shell is semi toroidal, and the second shell of the second sensor portion is configured to be coupled to the first shell of the first sensor portion to form a single toroid that defines the aperture.

17. The apparatus of claim 16, wherein the actual sensitivity is also based on the calibrated temperature.

18. The apparatus of claim 16, wherein the measurement module is configured to be operatively coupled to the memory storing a temperature characteristic of the sensor device, the actual sensitivity is based on the calibrated sensitivity and the temperature characteristic.

19. The apparatus of claim 1, wherein the sensor device includes a coupler defining an aperture that is configured to receive a post of the single toroid.

20. The apparatus of claim 1, wherein the second sensor portion is configured to be coupled to the first sensor portion via a plug and socket interface.

21. The apparatus of claim 1, wherein the measurement module is integrally connected to the first and second sensor portions.

* * * * *